United States Patent
Chen et al.

(10) Patent No.: US 10,312,228 B2
(45) Date of Patent: Jun. 4, 2019

(54) DISPLAY DEVICE

(71) Applicant: InnoLux Corporation, Miao-Li County (TW)

(72) Inventors: Jia-Yuan Chen, Miao-Li County (TW); Hsiao-Lang Lin, Miao-Li County (TW); Jui-Jen Yueh, Miao-Li County (TW); Kuan-Feng Lee, Miao-Li County (TW)

(73) Assignee: InnoLux Corporation, Miao-Li (TW)

( * ) Notice: Subject to any disclaimer, the term of this patent is extended or adjusted under 35 U.S.C. 154(b) by 0 days.

(21) Appl. No.: 15/588,707

(22) Filed: May 8, 2017

(65) Prior Publication Data

US 2018/0210280 A1 Jul. 26, 2018

Related U.S. Application Data

(60) Provisional application No. 62/450,106, filed on Jan. 25, 2017.

(51) Int. Cl.

| | | |
|---|---|---|
| *H01J 1/62* | (2006.01) | |
| *H01L 27/01* | (2006.01) | |
| *H01L 27/02* | (2006.01) | |
| *H01L 27/12* | (2006.01) | |
| *H01L 29/06* | (2006.01) | |
| *H01L 29/417* | (2006.01) | |
| *H01L 29/786* | (2006.01) | |
| *G02F 1/133* | (2006.01) | |
| *G02F 1/1333* | (2006.01) | |
| *G02F 1/1343* | (2006.01) | |
| *G02F 1/1347* | (2006.01) | |
| *G02F 1/153* | (2006.01) | |
| *H01L 27/32* | (2006.01) | |

(Continued)

(52) U.S. Cl.
CPC .......... *H01L 27/016* (2013.01); *G02F 1/1343* (2013.01); *G02F 1/1347* (2013.01); *G02F 1/13306* (2013.01); *G02F 1/133305* (2013.01); *G02F 1/133308* (2013.01); *G02F 1/1533* (2013.01); *H01L 27/0218* (2013.01); *H01L 27/1251* (2013.01); *H01L 27/32* (2013.01); *H01L 29/0653* (2013.01); *H01L 29/41733* (2013.01); *H01L 29/786* (2013.01); *H01L 51/0097* (2013.01); *H01L 51/5256* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2006/0082698 A1* | 4/2006 | Ko | G02F 1/133606 349/61 |
| 2007/0145892 A1* | 6/2007 | Chen | H01L 51/5271 313/506 |

(Continued)

*Primary Examiner* — Andrew J Coughlin
(74) *Attorney, Agent, or Firm* — Winston Hsu

(57) ABSTRACT

A display device includes a light-emitting unit and a light conversion layer. The light conversion layer is disposed on the light-emitting unit, and the light conversion layer includes plural quantum dot portions and a first shielding portion surrounding the plural quantum dot portions. One of the plural quantum dot portions has a surface and at least a part of the surface is a curved surface.

14 Claims, 10 Drawing Sheets

(51) Int. Cl.
*H01L 51/00* (2006.01)
*H01L 51/52* (2006.01)

(56) References Cited

U.S. PATENT DOCUMENTS

| | | | | |
|---|---|---|---|---|
| 2007/0159061 | A1* | 7/2007 | Krummacher | B82Y 20/00 313/501 |
| 2008/0074583 | A1* | 3/2008 | Li | G02F 1/133617 349/71 |
| 2008/0246388 | A1* | 10/2008 | Cheon | G02F 2/02 313/501 |
| 2013/0082589 | A1* | 4/2013 | So | H01L 51/5036 313/504 |
| 2013/0242228 | A1* | 9/2013 | Park | G02F 1/133617 349/61 |
| 2014/0027724 | A1* | 1/2014 | Lim | H01L 51/5281 257/40 |
| 2015/0311250 | A1* | 10/2015 | Seo | H01L 51/5012 257/89 |

\* cited by examiner

DISPLAY DEVICE

CROSS REFERENCE TO RELATED APPLICATION

This application claims the benefit of U.S. Provisional Patent Application No. 62/450,106, filed on Jan. 25, 2017.

BACKGROUND OF THE DISCLOSURE

1. Field of the Disclosure

The present disclosure relates to a display device, and more particularly, to a display device including a light conversion layer.

2. Description of the Prior Art

To raise the color saturation of a display for better image quality, a manufacturer in this field has proposed an approach which applies a full-layered enhancement film to a backlight module consisting of blue LEDs. The full-layered enhancement film is capable of converting the incident blue light into white light.

Generally, the light converted by the full-layered enhancement film is subsequently applied to a display panel. However, the color gamut of the light degrades after passing multiple layers formed of different materials in the display panel, such as the color filter layer, and the visual experience of the user is therefore limited.

SUMMARY OF THE DISCLOSURE

The present disclosure provides a display device that includes a light-emitting unit and a light conversion layer. The light conversion layer is disposed on the light-emitting unit, and the light conversion layer includes plural quantum dot portions and a first shielding portion surrounding the plural quantum dot portions. One of the quantum dot portions has a surface and at least a part of the surface is a curved surface.

The present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

Figure 1:
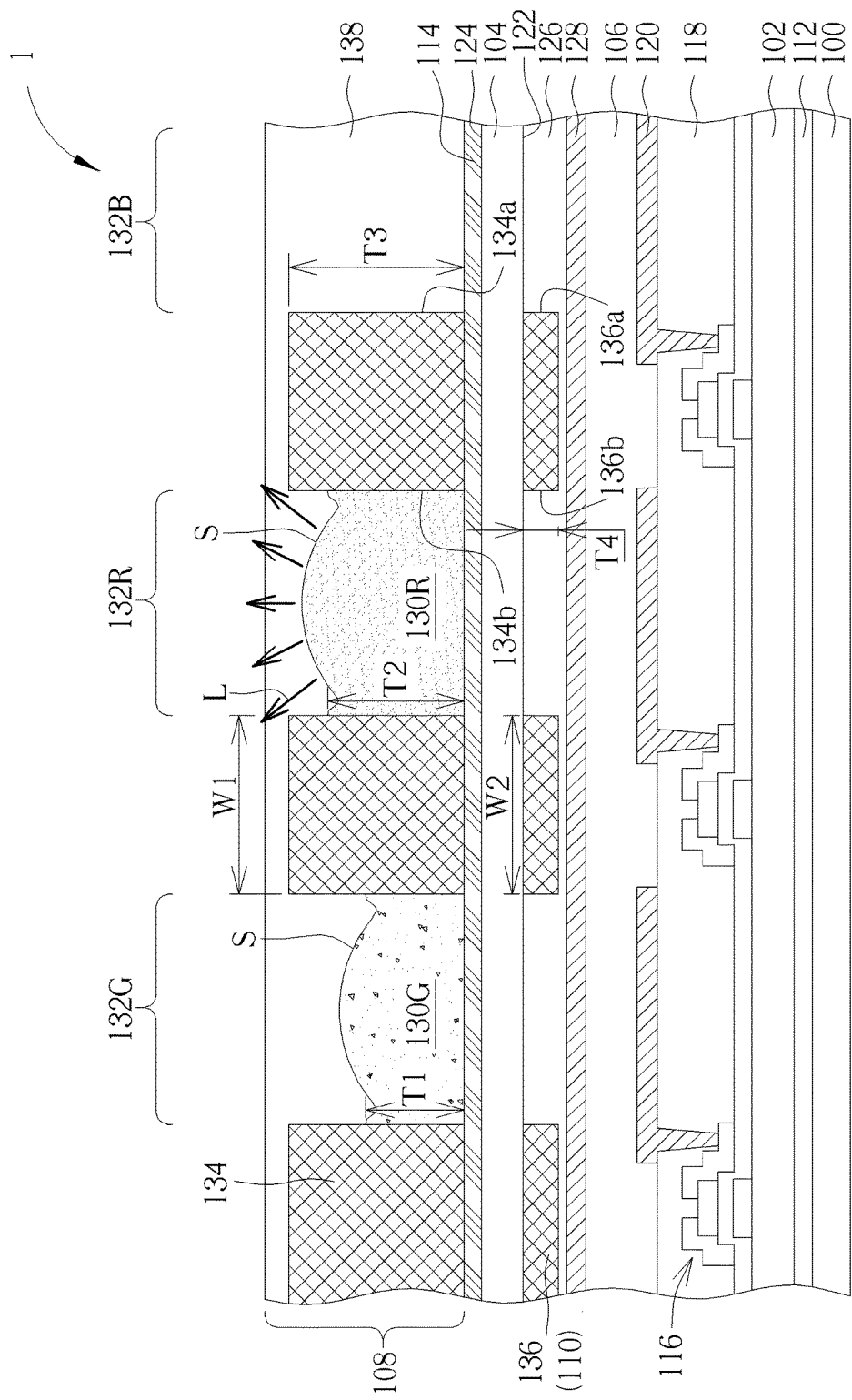
FIG. 1 is a cross-sectional diagram of a display device according to a first embodiment of the present disclosure.

Referring to FIG. 1, FIG. 1 is a cross-sectional diagram of a display device 1 according to a first embodiment of the present disclosure. As shown in FIG. 1, the display device 1 of the first embodiment includes a light-emitting unit 100 disposed at a side of a first substrate 102 and a light conversion layer 108 disposed at a side of a second substrate 104. In this embodiment, the first substrate 102 is disposed between the light-emitting unit 100 and the light conversion layer 108, and a display medium layer 106 is disposed between the first substrate 102 and the second substrate 104 and may include a liquid crystal layer. The light conversion layer 108 is disposed on the light-emitting unit 100, and the second substrate 104 is disposed between the light-emitting unit 100 and the light conversion layer 108. The light-emitting unit 100 is a blue-light backlight module, which may include blue-light LEDs that emit blue light for example. The first substrate 102 and the second substrate 104 may include transparent substrates respectively, for example, a rigid substrate such as a glass substrate or a quartz substrate, or a flexible substrate such as a plastic substrate, but not limited thereto. The plastic substrate may include material such as polyimide (PI), polycarbonate (PC), or polyethylene terephthalate (PET). Additionally, the first substrate 102 is a thin-film transistor (TFT) substrate. In other words, plural switch elements, such as thin-film transistors (TFTs) 116 are disposed on a surface of the first substrate 102, and the light conversion layer 108 is disposed on a surface of the second substrate 104. A polarizer 112 is disposed between the light-emitting unit 100 and the first substrate 102, and a polarizer 114 is disposed on the second substrate 104, between the light-emitting unit 100 and the light conversion layer 108. The polarizer 112 is formed with plastic material, and the polarizer 114 is formed with a material that has better heat endurance, such as but not limited to metal. In the first embodiment of the present disclosure, the polarizer 114 is a wire grid polarizer (WGP). It should be noted that, in the following embodiments, the wire grid polarizer (WGP) can be replaced by any polarizer 114 that has better heat endurance.

In addition, a plurality of thin-film transistors (TFTs) 116, a plurality of scan lines and data lines (not shown), and a plurality of pixel electrodes 120 are disposed on the first substrate 102. The scan lines cross the data lines to define a plurality of sub-pixel regions on the first substrate 102. Each sub-pixel is disposed on each sub-pixel region, and each sub-pixel includes at least one TFT 116 and one pixel electrode 120 electrically connected thereto. Further, each pixel electrode 120 is disposed corresponding to an aperture of the corresponding sub-pixel in a direction perpendicular to the surface of the first substrate 102. The TFTs 116 may be any type of TFT generally used in the art, such as bottom gate type TFT shown in FIG. 1. In this embodiment, a passivation layer 118 covers the TFTs 116, and each pixel electrode 120 is electrically connected to one of the TFTs 116 through a contact hole in the passivation layer 118. It should be noted that, in an organic light-emitting diode (OLED) display, a plurality of driving circuits are periodically arranged as a matrix on the first substrate and a plurality of light-emitting units with anodes are electrically connected thereto. Each sub-pixel in an OLED display includes one of the driving circuits and one of the anodes electrically thereto. Each anode receives current from its corresponding driving circuit.

The second substrate 104 includes a first surface 122 and a second surface 124 opposite to the first surface 122, wherein the first surface 122 is closer to the first substrate 102 than the second surface 124. An insulating layer 126 and a common electrode 128 are sequentially disposed on the first surface 122 of the second substrate 104 along a direction from the second substrate 104 toward the first substrate 102. The pixel electrodes 120 and the common electrode 128 may include any transparent material generally used in the art, such as ITO or IZO, but not limited thereto. In some other embodiments, the pixel electrodes 120 and the common electrode 128 may both be disposed on the surface of the same substrate, such as on the surface of the first substrate 102, and therefore an additional insulating layer is required to be disposed between the pixel electrodes 120 and the common electrode 128.

In addition, the light conversion layer 108 includes plural quantum dot portions, and each of the quantum dot portions is disposed in the aperture of one of the sub-pixels and overlaps the corresponding pixel electrode 120 in the direction perpendicular to the surface of the first substrate 102. For example, the light conversion layer 108 of this embodiment includes a plurality of first quantum dot portions 130G and a plurality of second quantum dot portions 130R. Each of the first quantum dot portions 130G is disposed in an aperture 132G of a first sub-pixel. The quantum dot material(s) or particles in the first quantum dot portions 130G are capable of converting the light (i.e. blue light in this embodiment) emitted from the light-emitting unit 100 into green light, which are represented as green-QD hereinafter, and therefore the first sub-pixels are green sub-pixels. Similarly, each of the second quantum dot portions 130R is disposed in an aperture 132R of a second sub-pixel, the quantum dot material (s) or particles in the second quantum dot portions 130R are capable of converting the light emitted from the light-emitting unit 100 into red light, which are represented as red-QD hereinafter, and therefore the second sub-pixels are red sub-pixels.

In this embodiment, the display device 1 further includes a plurality of third sub-pixels, wherein each of the third sub-pixels has an aperture 132B, and no quantum dot portions of the light conversion layer 108 is corresponding to the aperture 132B. Since the light-emitting unit 100 of this disclosure emits blue light, the light emits through the apertures 132B of the third sub-pixels are still blue light and the third sub-pixels are blue sub-pixels. Accordingly, it is not necessary to additionally dispose blue quantum dot material(s) or particles in the aperture 132B, but not limited thereto. In some embodiments, small amounts of green quantum dot material(s) or particles are disposed in the aperture 132B. In some embodiments, the light-emitting unit 100 is a UV-light backlight module, and the UV-light backlight module may include UV LEDs which produce ultraviolet (UV) light for example. Under this circumstance, blue quantum dot material(s) or particles may be disposed in the aperture 132B, so as to convert the UV light into blue light.

As shown in FIG. 1, the first quantum dot portions 130G and the second quantum dot portions 130R respectively have a thickness T1 and a thickness T2 in a cross sectional view. The first quantum dot portion 130G includes two side parts which are in contact with the first shielding portion 134. And the thickness of one of the two side parts with greater thickness is defined as the thickness T1 of the first quantum dot portion 130G. Similarly, the second quantum dot portion 130R includes two side parts which are in contact with the first shielding portion 134. And the thickness of one of the two side parts with greater thickness is defined as the thickness T2 of the second quantum dot portion 130R. However, if the two side parts have the same thickness, the thickness of the quantum dot portion is defined as the thickness of either one of the two side parts. At least one of the thickness T1 and the thickness T2 is between 3 micrometers and 130 micrometers. In this embodiment, at least one of the thickness T1 and the thickness T2 is between 3 micrometers and 70 micrometers, and in some other embodiments, at least one of the thickness T1 and the thickness T2 is between 3 micrometers and 8 micrometers, based on the light conversion efficiency and concentration of the quantum dot particles in the quantum dot portions. The concentrations of the quantum dot particles in the first quantum dot portion 130G and the second quantum dot portion 130R may not be identical and may be between 0.3 wt % and 13.4 wt %. In some embodiments, the concentrations of the quantum dot particles in one of the first quantum dot portion 130G and the second quantum dot portion 130R may be between 0.5 wt % and 13.4 wt %. Generally, since the absorbance or the conversion efficiency of red-QD is lower than green-QD, the thickness T2 is greater than the thickness T1 in this embodiment, but not limited thereto. It is noteworthy that the thickness of the quantum dot portion and the concentration of the quantum dot particles are inverse proportional under the same absorbance of the quantum dot particles in the quantum dot portion. Therefore, the thickness of the quantum dot portion can be adjusted in accordance with the adjustment of the concentration of the quantum dot particles. According to the display device 1 of this embodiment, wherein the light conversion layer 108 is served as a Quantum Dot Color Filter (QDCF) layer to replace the traditional color filter layer in the display panel, such as a liquid crystal panel. There are few examples of the thickness of the quantum dot portion and the concentration of the quantum dot particles listed in the following Table 1, but the present disclosure is not limited to those parameters in the Table 1. In some embodiments, the thickness T2 of the second quantum dot portion 130R and the thickness T1 of the first quantum dot portion 130G may be the same, and this can be achieved by adopting the quantum dot particles in the second quantum dot portion 130R with higher concentration. In some embodiments, the quantum dot particles in the first quantum dot portion 130G and the second quantum dot portion 130R are both adopting the quantum dot particles with high concentration. Thus, the thickness T1 and the thickness T2 may be reduced to between 3 micrometers and 8 micrometers for example.

TABLE 1

The thickness of the quantum dot portion and the concentration of the quantum dot particles

| Thickness (micrometer) | Concentration (wt %) |
| --- | --- |
| 100 | 0.4 |
| 70 | 0.57 |
| 8 | 5 |
| 3 | 13.33 |
| 1.6 | 25 |

In addition, one of the quantum dot portions has a surface and at least apart of the surfaces is a curved surface. In this embodiment, each of the first quantum dot portions 130G and the second quantum dot portions 130R has a surface which is the top surface or the outer surface of the quantum dot portions shown in FIG. 1, and at least a part of the surfaces is a curved surface S. Further, the curved surfaces S of the first quantum dot portions 130G and the second quantum dot portions 130R in this embodiment are convex surfaces, but not limited thereto. For example, as shown in FIG. 1, since the curved surface S of the second quantum dot portion 130R is a light-emitting surface, the light L can be emitted in many different directions from the convex surface after being converted by the second quantum dot portion 130R. Therefore, the view angle of the display device 1 can be widened.

In another aspect, the light conversion layer 108 also includes a first shielding portion 134. The first shielding portion 134 surrounds the first quantum dot portions 130G and the second quantum dot portions 130R in a plan view, and wherein the plan view is an orthogonal projection of an object onto the first substrate 102. The first shielding portion 134 may also surrounds the apertures 132R, 132G, and 132B of the sub-pixels. In other words, the first shielding portion 134 has at least one patterned layer with openings corresponding to the apertures of the sub-pixels, and it may be seemed that the pattern of the first shielding portion 134 defines the apertures of the sub-pixels. The first shielding portion 134 may include any material that can block light, such as metal material, black inorganic material, black organic materials or photoresist materials. For example, the material generally used for forming the black matrix may be adopted to form the first shielding portion 134. The first shielding portion 134 is disposed on the second surface 124 of the second substrate 104 and between two of the quantum dot portions, and therefore the first shielding portion 134 and the quantum dot portions in this embodiment are positioned on the same surface of the second substrate 104, while the first quantum dot portions 130G and the second quantum dot portions 130R are disposed in the openings of the first shielding portion 134 composed of a patterned layer. Furthermore, the display device 1 may optionally include a shielding layer 110, wherein the shielding layer 110 includes a second shielding portion 136 disposed on the first surface 122 of the second substrate 104. The shielding layer 110 is spaced apart from the light conversion layer 108 and the second shielding portion 136 is overlapped with the first shielding portion 134 in the direction perpendicular to the surface of the first substrate 102. In other words, the first shielding portion 134 and the second shielding portion 136 are respectively disposed on opposite surfaces of the second substrate 104. In addition, at least one of the first shielding portion 134 or the second shielding portion 136 overlaps the TFTs 116, the scan lines or the data lines on the first substrate 102.

As shown in FIG. 1, the first shielding portion 134 has a first thickness T3 and the second shielding portion 136 has a second thickness T4 in a cross sectional view. The first shielding portion 134 includes two side parts 134a, 134b at two opposite sides thereof in the cross sectional view. The thickness of one of the two side parts 134a, 134b with greater thickness is defined as the first thickness T3 of the first shielding portion 134. Similarly, the second shielding portion 136 includes two side parts 136a, 136b at two opposite sides thereof in the cross sectional view. The thickness of one of the two side parts 136a, 136b with greater thickness is defined as the second thickness T4 of the second shielding portion 136. However, if the two side parts have the same thickness, the thickness of the first shielding portion 134 or the second shielding portion 136 is defined as the thickness of either one of the two side parts. The first thickness T3 of the first shielding portion 134 is greater than or at least equal to the thickness T1 of the first quantum dot portions 130G and the thickness T2 of the second quantum dot portions 130R, thus the first thickness T3 may be modified based on the thicknesses of the quantum dot portions. For example, the second thickness T4 is between 0.2 micrometers and 2 micrometers, and the first thickness T3 of this embodiment is between 8 micrometers and 70 micrometers when the thickness of the quantum dot portions is between 3 micrometers to 70 micrometers. Accordingly, the ratio of the first thickness T3 to the second thickness T4 is between 4 and 350. In another embodiment, the first thickness T3 is between 3 micrometers and 8 micrometers when the thickness of the quantum dot portions is between 3 micrometers to 8 micrometers, and therefore the ratio of the first thickness T3 to the second thickness T4 is between 1.5 and 40. In addition, the first width W1 of the first shielding portion 134 and the second width W2 of the second shielding portion 136 between adjoining apertures are approximately the same, but not limited thereto. In some embodiments, the first shielding portion 134 and the second shielding portion 136 have different widths. The first shielding portion 134 can reduce the mixing of different colors of the light between the adjoining sub-pixels. The second shielding portion 136 can reduce the light leakage or crosstalk.

In addition, the light conversion layer 108 further includes an insulating layer 138 disposed on the second surface 124 of the second substrate 104 and the insulating layer 138 covers the first shielding portion 134 and the plural quantum dot portions. Specifically, the insulating layer 138 fills in the openings of the first shielding portion 134, including the openings corresponding to the apertures 132B of blue sub-pixels. The shielding layer 110 further includes an insulating layer 126 disposed on the first surface 122 of the second substrate 104 and the insulating layer 126 covers the second shielding portion 136. The insulating layers 126 and 138 may include transparent inorganic insulating layer or transparent organic insulating layer. For example, the insulating layer is a stacked layer composed of an organic insulating layer and an inorganic insulating layer.

In this embodiment, the display device 1 can be manufactured by the following method. Firstly, the light-emitting unit 100, the polarizer 112, the first substrate 102, and the second substrate 104 are provided, and the TFTs 116, the passivation layer 118, the pixel electrode 120 are formed on the first substrate 102. Secondly, the WGP 114 and the light conversion layer 108 are sequentially formed on the second surface 124 of the second substrate 104. Next, the shielding layer 110 is formed on the first surface 122 of the second substrate 104. Then, the first substrate 102 and the second substrate 104 are assembled to form the display device 1. Since the processes for forming the light conversion layer 108 is performed on the second substrate 104, the WGP 114 that has better heat endurance is adopted rather than the plastic polarizer. In some embodiment, the light conversion layer 108 may further include an encapsulation layer formed on the insulating layer 138. The material of the encapsulation layer may include inorganic insulating material or organic insulating material. For example, the encapsulation layer is an inorganic/organic/inorganic composite layer.

According to this embodiment, the light conversion layer 108 includes different quantum dot portions that can convert the light emitted by the light-emitting unit 100 into different colors of light, and the light conversion layer 108 is used for replacing the conventional color filter layer. Owing to this configuration, the color gamut of the display device 1 can be improved, and the display device 1 can provide a better visual experience. In addition, the full-layered enhancement film is no longer required in the backlight module, and therefore the thickness of the display device can further be reduced.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 2:
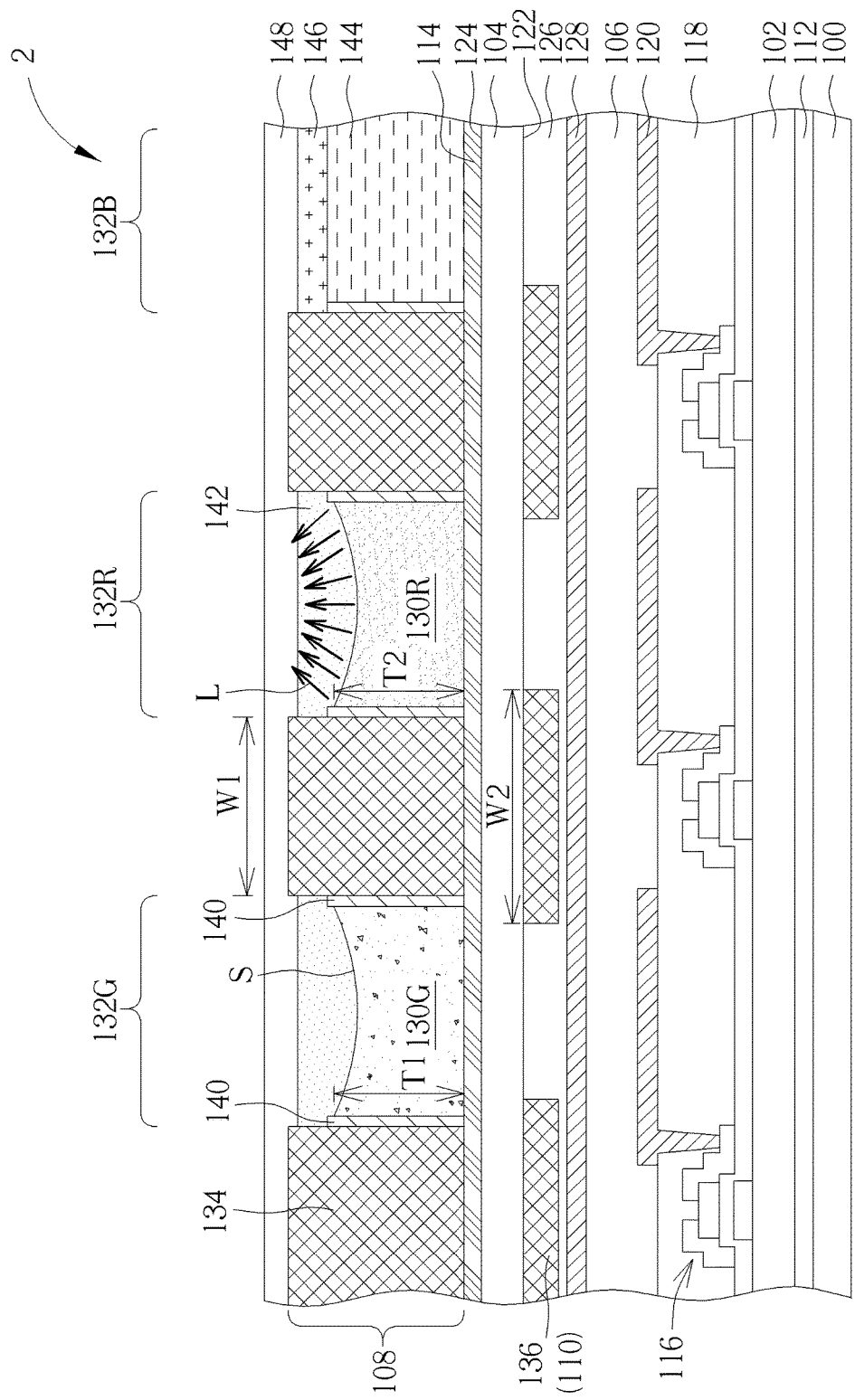
FIG. 2 is a cross-sectional diagram of a display device according to a second embodiment of the present disclosure.

Referring to FIG. 2, FIG. 2 is a cross-sectional diagram of a display device 2 according to a second embodiment of the present disclosure. In this embodiment, the curved surfaces S of the first quantum dot portions 130G and the second quantum dot portions 130R are concave surfaces. Since the concave surfaces are the light emitting surfaces of the first quantum dot portions 130G and the second quantum dot portions 130R, the light L can be emitted in many different directions after being converted by those quantum dot portions, and thus the view angle of a display device 2 can be widened. The light conversion layer 108 further includes a reflective portion 140 disposed at the sidewalls of the first shielding portion 134. In other words, the reflective portion 140 is disposed between the first shielding portion 134 and the plural quantum dot portions. The reflective portion 140 may include a metal layer or a reflective layer/multilayer. The reflective portion 140 is used for reflecting the lateral light back to the corresponding quantum dot portion, and the lateral light that is reflected by the reflective portion 140 can then be converted by the corresponding quantum dot portion, so as to improve the conversion efficiency. The reflective portion 140 can also prevent the lateral light from being absorbed by the adjoining first shielding portion 134. In some embodiments, the reflective portion 140 may have specific material or composition that only reflects a specific color of light, such as blue light, but not limited thereto. The height of the reflective portion 140 is approximately equal to the thickness of at least one of the plural quantum dot portions. In this embodiment, the height of the reflective portion 140 is approximately equal to the thickness T1 of the corresponding first quantum dot portion 130G or the thickness T2 of the corresponding second quantum dot portion 130R. Therefore, the reflective portion 140 covers a lower portion of the sidewall of the first shielding portion 134 and exposes an upper portion of the sidewall of the first shielding portion 134. In addition, in this embodiment, the thickness T1 of the first quantum dot portion 130G and the thickness T2 of the second quantum dot portion 130R are approximately the same. It should be noted that the thickness of the quantum dot portion respectively represent, in a cross sectional view, the maximum thickness of the edge of the quantum dot portion where the quantum dot portion contacts the reflective portion 140 or the first shielding portion 134.

The light conversion layer 108 further includes a plurality of filtering portions 142 respectively disposed on some of the quantum dot portions. In this embodiment, the filtering portions 142 are respectively disposed on the first quantum dot portions 130G and the second quantum dot portions 130R. The filtering portions 142 may include a layer/multilayer that can keep the blue light from penetrating the filtering portions 142, so as to maintain the color purity (such as red-light or green-light) of the sub-pixel. The filtering portions 142 used in the red sub-pixel and the green sub-pixel may include different layers. In addition, the filtering portions 142 may also have materials that can reflect a specific color of light, such as blue light, back to the quantum dot portions, and the reflected light can then be converted by the corresponding quantum dot portion. Therefore, the reflective portion 140 and the filtering portions 142 can further effectively improve the conversion efficiency of the quantum dot portions.

Furthermore, the light conversion layer 108 additionally includes a transparent layer 144 disposed on the second surface 124 of the second substrate 104 and disposed in the openings of the first shielding portion 134 that corresponds at least a portion of the apertures 132B. The transparent layer 144 may include organic transparent material or inorganic transparent material, such that the blue light emitted by the light-emitting unit 100 can penetrate through the transparent layer 144. The transparent layer 144 may further include scattering particles that can scatter the blue light. In addition, a filter layer 146 may be optionally disposed on the transparent layer 144. The filter layer 146 can be used for adjusting the intensity of the blue light, so as to balance the intensity of blue light emitted from the aperture 132B with the intensities of the red light and green light from the aperture 132R and 132G. In some embodiments, the filter layer 146 may also be disposed on the first quantum dot portion 130G or the second quantum dot portion 130R. The display device 2 further includes an encapsulation layer 148 disposed on the second surface 124 of the second substrate 104. The encapsulation layer 148 covers the first shielding portion 134, the first quantum dot portions 130G, the second quantum dot portions 130R, and the transparent layer 144. The encapsulation layer 148 may include transparent organic insulating layer or transparent inorganic insulating layer. In some embodiment, the encapsulation layer 148 is an inorganic/organic/inorganic composite layer.

In this embodiment, the second width W2 of the second shielding portion 136 is greater than the first width W1 of the first shielding portion 134. However, in a variant embodiment, the second width W2 may be equal to the first width W1. Since the first width W1 of the first shielding portion 134 is smaller and the openings of the first shielding portion 134 have greater size, the area of the quantum dot portions or the area of the apertures of the sub-pixels is greater. According to this configuration, the area of the quantum dot portions that convert light and emit light is increased, and therefore the performance of the display device 2 is improved. For example, a difference between the second width W2 and the first width W1 is between 2 micrometers and 62 micrometers. In some embodiments, the first width W1 may be reduced to a minimum width that can be formed by a manufacturing apparatus.

Figure 3:
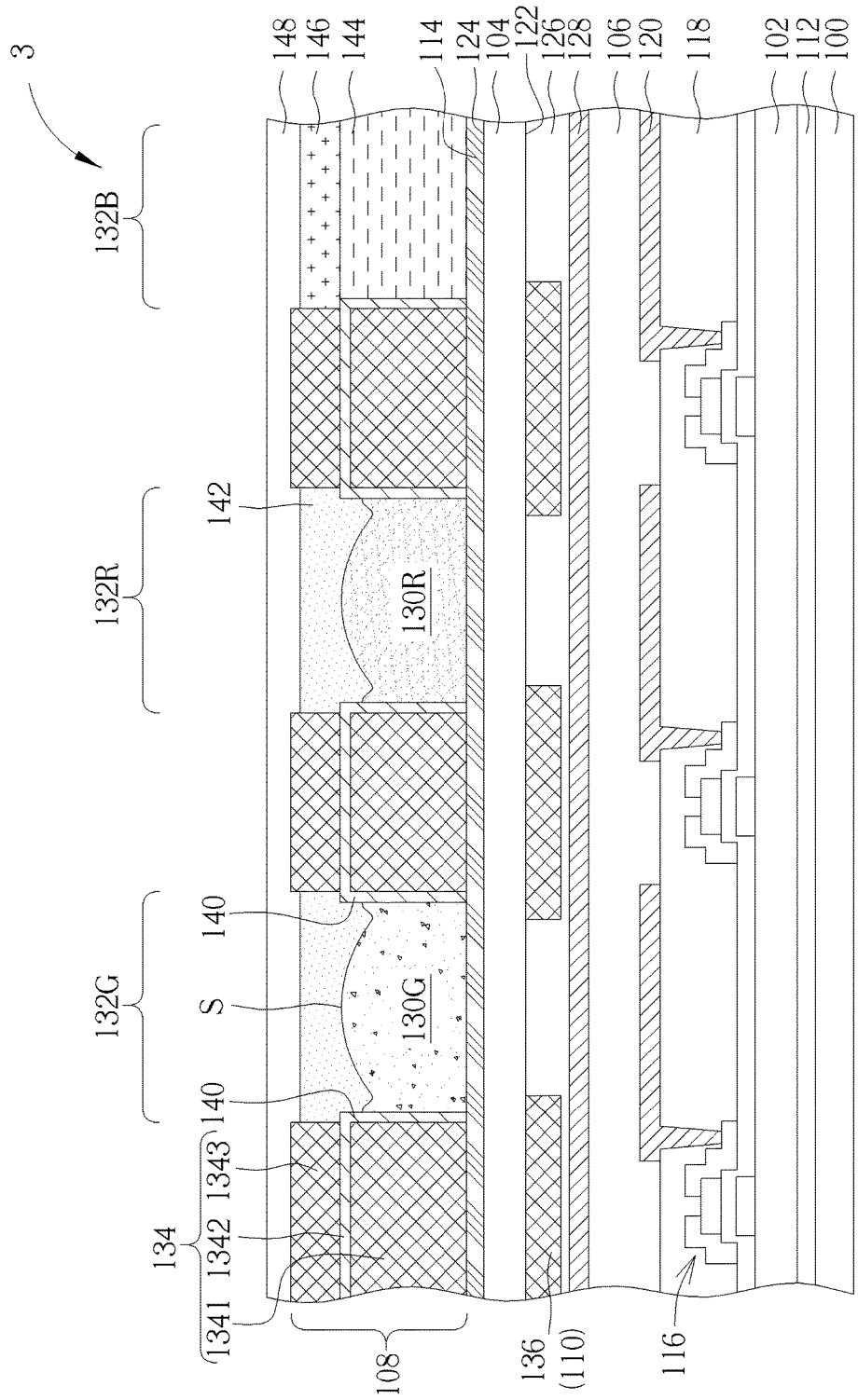
FIG. 3 is a cross-sectional diagram of a display device according to a third embodiment of the present disclosure.

Referring to FIG. 3, FIG. 3 is a cross-sectional diagram of a display device 3 according to a third embodiment of the present disclosure. As shown in FIG. 3, the main difference between this embodiment and the second embodiment is that the first shielding portion 134 includes two or more first shielding units stacked with each other, and the two or more first shielding units may respectively include different materials. In this embodiment, the first shielding portion 134 includes a first shielding unit 1341, a first shielding unit 1342, and a first shielding unit 1343, wherein the first shielding unit 1342 is disposed between the first shielding unit 1341 and the first shielding unit 1343. The material of the first shielding unit 1342 is different from the material of the first shielding unit 1341 and the first shielding unit 1343. The first shielding unit 1342 may include reflective material, such as metal, and may be composed of multiple layers, and the material of the first shielding unit 1342 may be the same as the reflective portion 140 of the display device 2. Each first shielding unit 1342 is connected to the adjacent reflective portion 140 disposed on the sidewalls of the first shielding unit 1341, wherein the first shielding unit 1342 covers the top surface of the first shielding unit 1341. Under this circumstance, the first shielding unit 1342 and the reflective portion 140 may be formed together when they are formed with the same material. The first shielding unit 1341 and the first shielding unit 1343 may include any material that is generally used for blocking light in the art. The thickness of the first shielding unit 1342 may be less than the thicknesses of the first shielding unit 1341 and the first shielding unit 1343, but not limited thereto. In addition, the curved surfaces S of the first quantum dot portions 130G and the second quantum dot portions 130R are convex surfaces in this embodiment, but not limited thereto.

Figure 4:
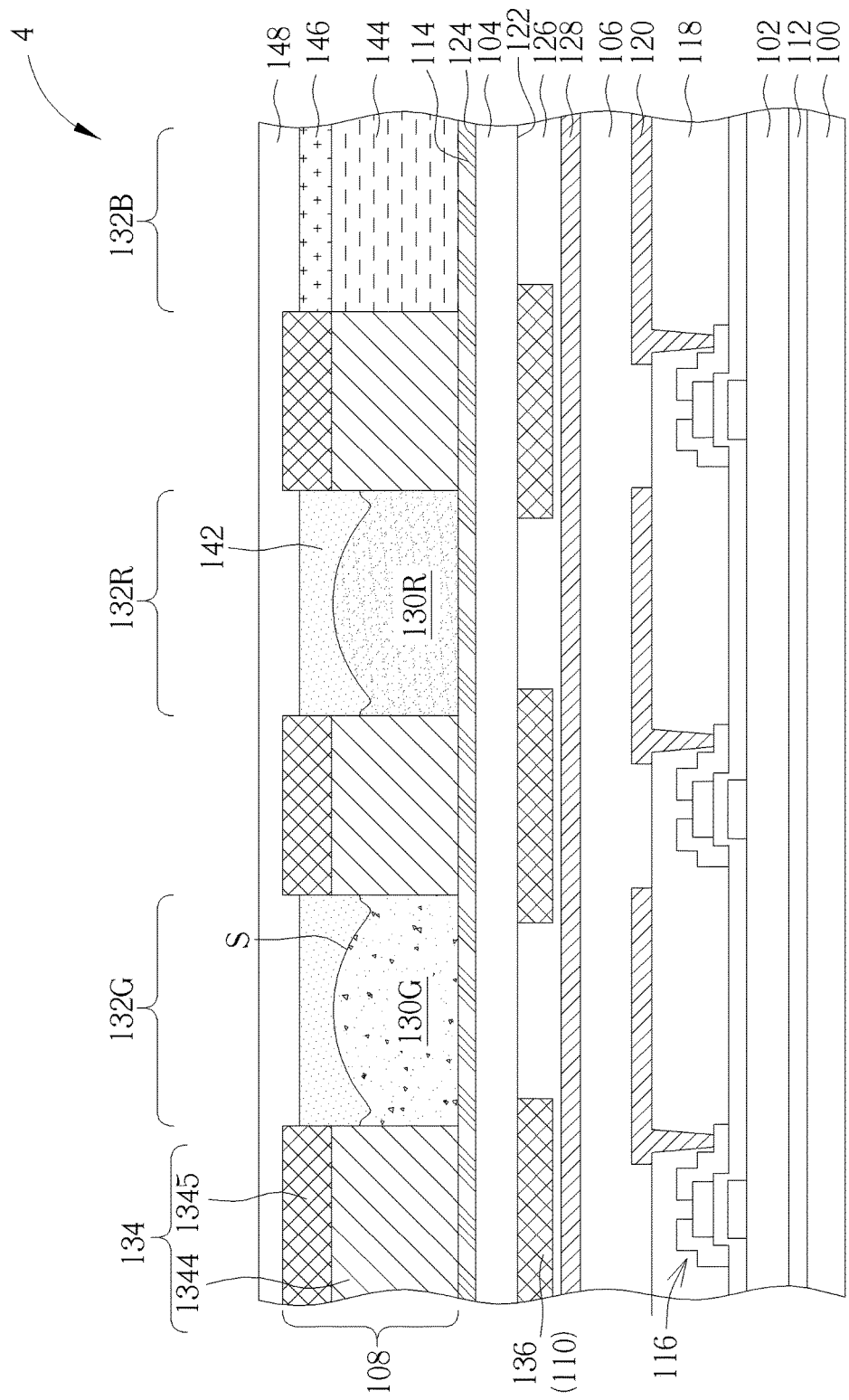
FIG. 4 is a cross-sectional diagram of a display device according to a fourth embodiment of the present disclosure.

Referring to FIG. 4, FIG. 4 is a cross-sectional diagram of a display device 4 according to a fourth embodiment of the present disclosure. As shown in FIG. 4, the main difference between this embodiment and the third embodiment is that the first shielding portion 134 includes a first shielding unit 1344 and a first shielding unit 1345, wherein the first shielding unit 1344 is disposed between the second substrate 104 and the first shielding unit 1345. The first shielding unit 1344 may include reflective material, such as metal, and may be composed of multiple layers, but not limited thereto. The material of the first shielding unit 1344 may be the same as the reflective portion 140 of the display device 2. The thickness of the first shielding unit 1344 is approximately the same as one or both of the thicknesses of the first quantum dot portion 130G and the second quantum dot portion 130R. The sidewalls of the first shielding unit 1344 is capable of reflecting light, and therefore the reflective portion in the preceding embodiments are not required in this embodiment. The first shielding unit 1345 may include any material that is generally used for blocking light in the art. The thickness of the first shielding unit 1345 may be, but not limited to, less than the thickness of the first shielding unit 1344, provided that the total thickness of the first shielding unit 1344 and the first shielding unit 1345 is greater than the thicknesses of the first quantum dot portion 130G and the second quantum dot portion 130R.

Figure 5:
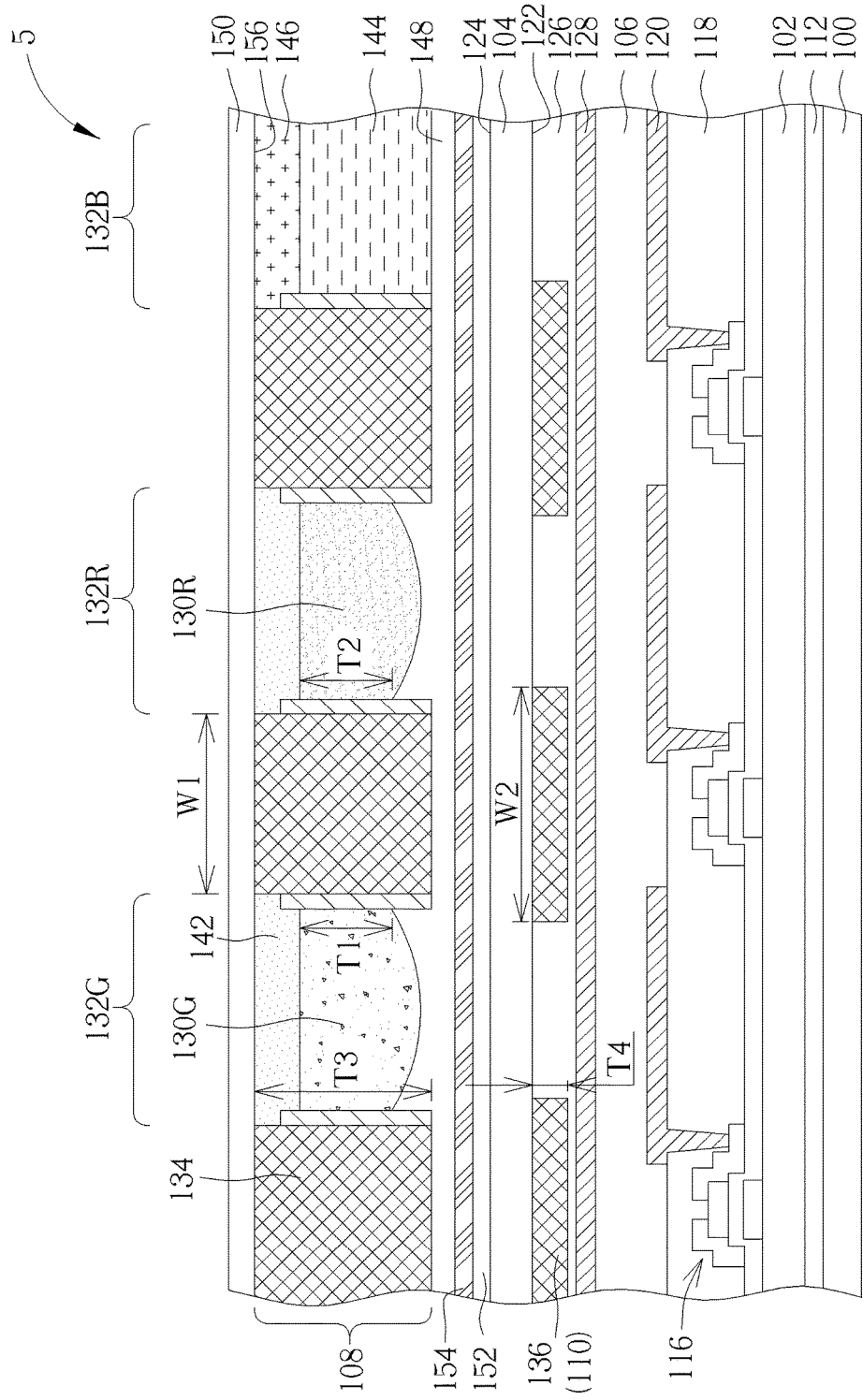
FIG. 5 is a cross-sectional diagram of a display device according to a fifth embodiment of the present disclosure.

Referring to FIG. 5, FIG. 5 is a cross-sectional diagram of a display device 5 according to a fifth embodiment of the present disclosure. The display device 5 further includes a third substrate 150 on the light conversion layer 108, thus the second substrate 104 is disposed between the third substrate 150 and the first substrate 102. The third substrate 150 may include a transparent substrate, for example, a rigid substrate such as a glass substrate or a quartz substrate, or a flexible substrate such as a plastic substrate, but not limited thereto. In this embodiment, The light conversion layer 108 is disposed between the second substrate 104 and the third substrate 150. In the apertures 132G (green sub-pixels) and the apertures 132R (red sub-pixels), the filtering portions 142 are disposed between the quantum dot portions and the third substrate 150. In the aperture 132B (blue sub-pixels), the filter layer 146 is disposed between the transparent layer 144 and the third substrate 150. In addition, the curved surfaces S of the first quantum dot portions 130G and the second quantum dot portions 130R in this embodiment are convex surfaces, but not limited thereto.

Furthermore, the display device 5 includes a polarizer 152 disposed between the second substrate 104 and the encapsulation layer 148. The polarizer 152 includes a plastic polarizer for example, and the polarizer 152 is used for replacing the WGP 114 in the preceding embodiments. The display device 5 further includes an adhesive layer 154 disposed between the polarizer 152 and the encapsulation layer 148. The adhesive layer 154 may include adhesive material such as thermo-curing material, light-curable material, or the mixtures thereof, and is used for attaching the light conversion layer 108 onto the polarizer 152.

In this embodiment, the thickness T1 of the first quantum dot portion 130G and the thickness T2 of the second quantum dot portion 130R are approximately the same, which are between 70 micrometers and 130 micrometers. The first thickness T3 of the first shielding portion 134 is greater than or equal to the thickness T1 of the first quantum dot portion 130G and the thickness T2 of the second quantum dot portion 130R, thus the first thickness T3 may be modified based on the thicknesses of the quantum dot portions. For example, the second thickness T4 of the second shielding portion 136 is between 0.2 micrometers and 2 micrometers, the first thickness T3 of the first shielding portion 134 is between 70 micrometers and 130 micrometers when the thickness of the quantum dot portions is between 70 micrometers and 130 micrometers. Therefore, the ratio of the first thickness T3 to the second thickness T4 is between 35 and 650, but not limited thereto. In addition, as described in the first embodiment, the thickness of the light conversion layer 108 may be thinner, and therefore the thickness of the first shielding portion 134 of the display device 5 may be further reduced.

In this embodiment, the display device 5 can be manufactured by the following method. Firstly, the light-emitting unit 100, the polarizer 112, the first substrate 102, the second substrate 104 are provided, and the TFTs 116, passivation layer 118, and the pixel electrode 120 are formed on the first substrate 102. Secondly, the light conversion layer 108 is formed on a surface 156 of the third substrate 150. Next, the adhesive layer 154 is formed on the polarizer 152, and the third substrate 150 is aligned with the second substrate 104, wherein the surface 156 of the third substrate 150 is configured to face the second surface 124 of the second substrate 104. Then, the third substrate 150 is adhered to the second substrate 104 via the adhesive layer 154 to form a component. Then, the component is assembled with the first substrate 150 to form the display device 5. Since the processes for forming the light conversion layer 108 are not performed on the second substrate 104, the polarizer 152 is not required to endure the heat created during the processes and may include the plastic material in this embodiment. In addition, the first width W1 of the first shielding portion 134 and the second width W2 of the second shielding portion 136 satisfy the following relation: (W2−W1)/2>2.5 micrometers, so as to prevent the alignment error and further reduce the light leakage.

Figure 6:
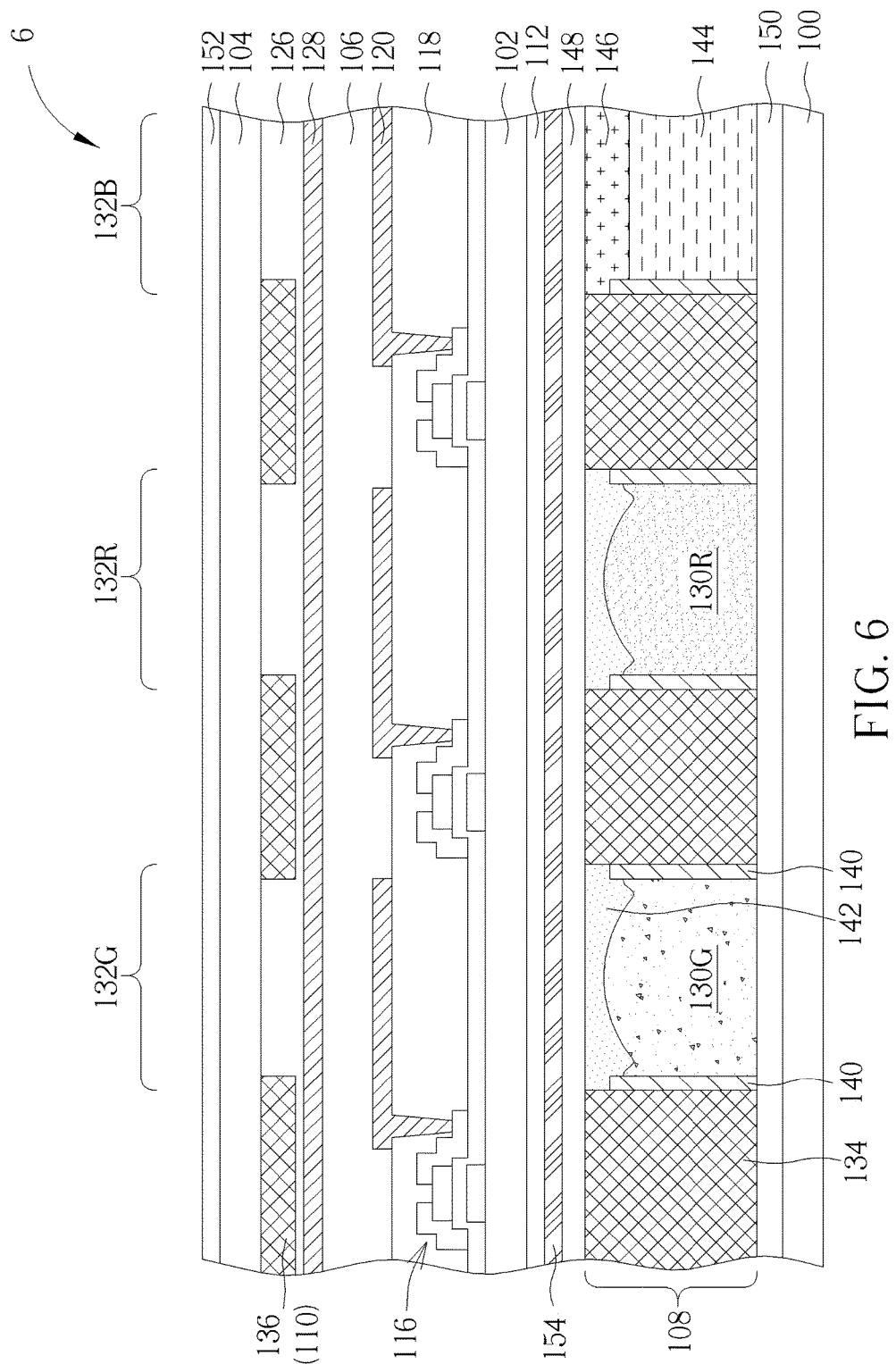
FIG. 6 is a cross-sectional diagram of a display device according to a sixth embodiment of the present disclosure.

Referring to FIG. 6, FIG. 6 is a cross-sectional diagram of a display device 6 according to a sixth embodiment of the present disclosure. In this embodiment, the third substrate 150 is disposed between the light-emitting unit 100 and the first substrate 102. The light conversion layer 108 is disposed between the first substrate 102 and the third substrate 150. In the apertures 132G (green sub-pixels) and the apertures 132R (red sub-pixels), the filtering portions 142 are disposed between the quantum dot portions 130G/130R and the encapsulation layer 148. In the apertures 132B (blue sub-pixels), the filter layer 146 is disposed between the transparent layer 144 and the encapsulation layer 148. In addition, the adhesive layer 154 is disposed between the encapsulation layer 148 and the polarizer 112 for attaching the light conversion layer 108 to the polarizer 112. In this embodiment, the light conversion layer 108 is disposed between the light-emitting unit 100 and the first substrate 102 (the TFT substrate). According to this configuration, the blue light emitted by the light-emitting unit 100 enters the light conversion layer 108 without passing through the display medium layer 106, and therefore the blue light can be prevented from being absorbed by the display medium layer 106, and the light converting efficiency of the light conversion layer 108 can further be improved.

Figure 7:
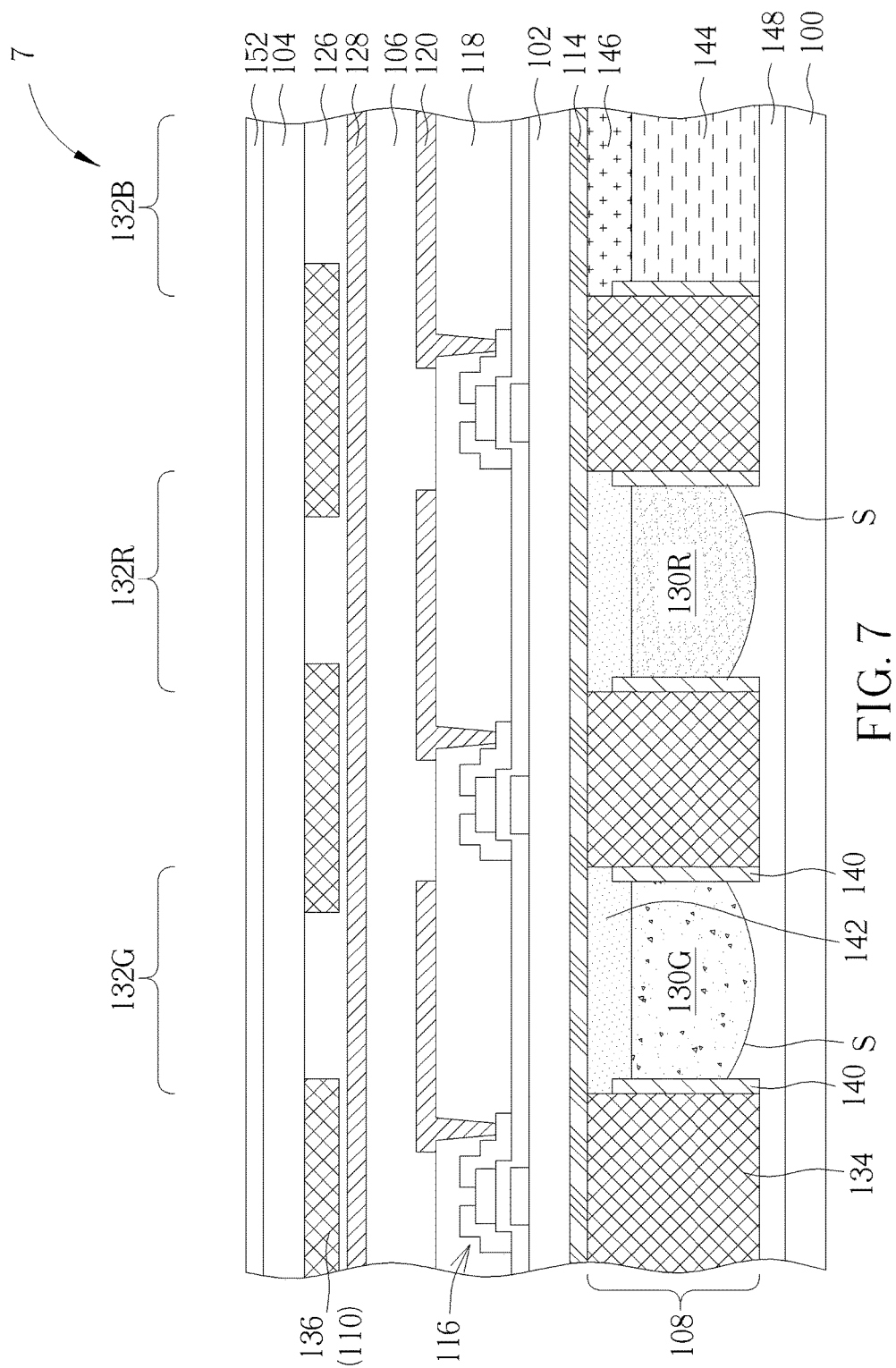
FIG. 7 is a cross-sectional diagram of a display device according to a seventh embodiment of the present disclosure.

Referring to FIG. 7, FIG. 7 is a cross-sectional diagram of a display device 7 according to a seventh embodiment of the present disclosure. As shown in FIG. 7, the difference between this embodiment and the sixth embodiment is that the light conversion layer 108 is disposed on the first substrate 102. The encapsulation layer 148 is disposed between the light-emitting unit 100 and the first substrate 102. In the apertures 132G (green sub-pixels) and the apertures 132R (red sub-pixels), the filtering portions 142 are disposed between the quantum dot portions 130G/130R and the first substrate 102. In the apertures 132B (blue sub-pixels), the filter layer 146 is disposed between the transparent layer 144 and the first substrate 102. In this embodiment, the WGP 114 is disposed on the first substrate 102 and between the light conversion layer 108 and the first substrate 102. The curved surfaces S of the first quantum dot portions 130G and the second quantum dot portions 130R in this embodiment are convex surfaces, but not limited thereto. In this embodiment, the light conversion layer 108 is disposed between the light-emitting unit 100 and the first substrate 102 (the TFT substrate). According to this configuration, the blue light emitted by the light-emitting unit 100 enters the light conversion layer 108 without passing through the display medium layer 106, and therefore the blue light can be prevented from being absorbed by the display medium layer 106, and the light converting efficiency of the light conversion layer 108 can further be improved.

Figure 8:
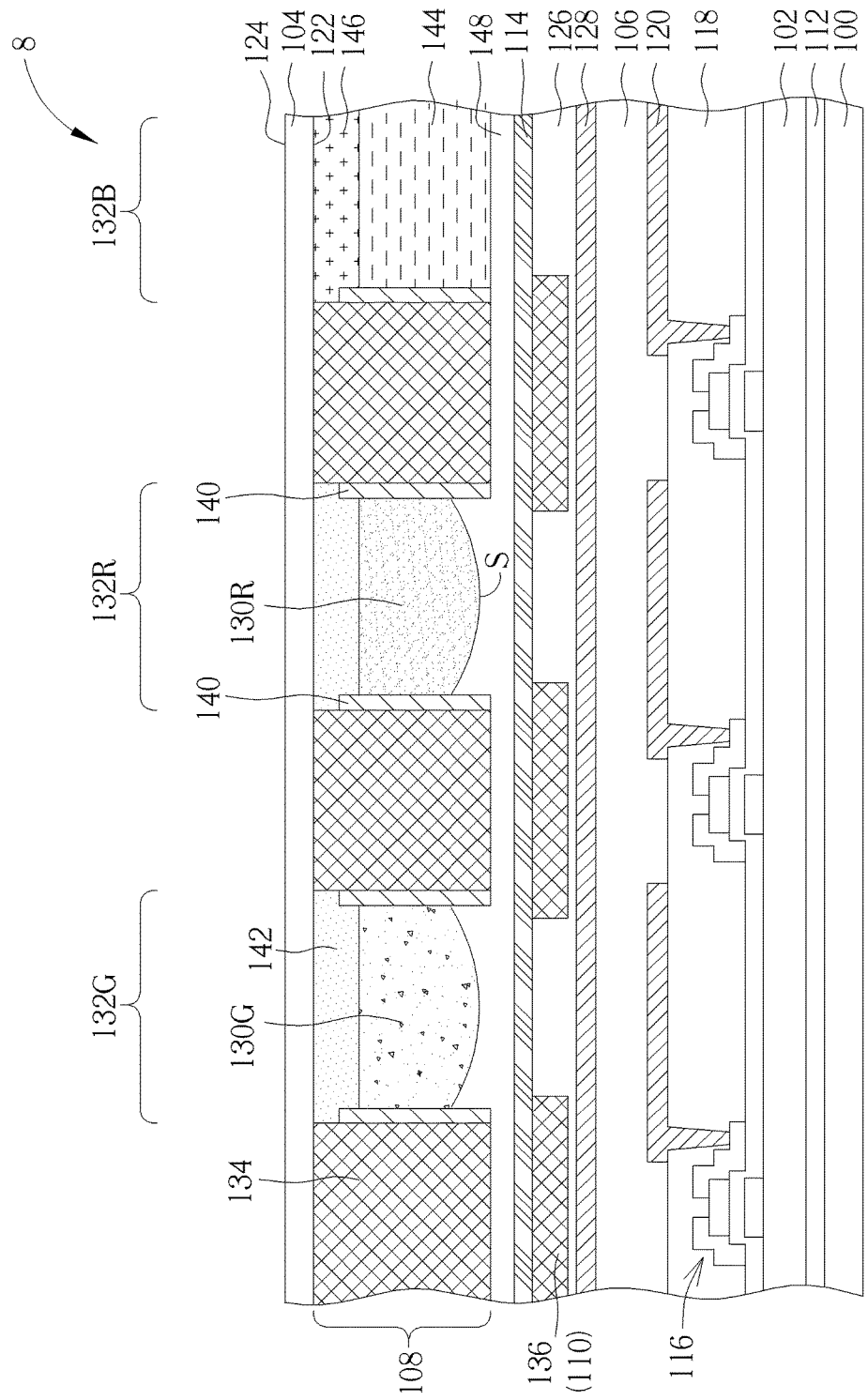
FIG. 8 is a cross-sectional diagram of a display device according to an eighth embodiment of the present disclosure.

Referring to FIG. 8, FIG. 8 is a cross-sectional diagram of a display device 8 according to an eighth embodiment of the present disclosure. As shown in FIG. 8, the main difference between this embodiment and the second embodiment is that the light conversion layer 108 is disposed between the first substrate 102 and the second substrate 104. The WGP 114 is disposed between the first shielding portion 134 and the second shielding portion 136, and the encapsulation layer 148 is disposed between the WGP 114 and the first shielding portion 134. In the apertures 132G (green sub-pixels) and the apertures 132R (red sub-pixels), the filtering portions 142 are disposed between the quantum dot portions 130G/130R and the second substrate 104. In the apertures 132B (blue sub-pixels), the filter layer 146 is disposed between the transparent layer 144 and the second substrate 104. In addition, the curved surfaces S of the first quantum dot portions 130G and the second quantum dot portions 130R in this embodiment are convex surfaces, but not limited thereto.

In this embodiment, the display device 8 can be manufactured by the following method. Firstly, the light-emitting unit 100, the polarizer 112, the first substrate 102 (the TFT substrate), and the second substrate 104 are provided, wherein the TFTs 116, the pixel electrodes 120, and the passivation layer 118 are formed on the first substrate 102. Secondly, the light conversion layer 108 and the common electrode 128 or other devices between the common electrode 128 and the second substrate 104 are formed on the first surface 122 of the second substrate 104. Thirdly, a sealant (not shown in FIG. 8) is formed on the periphery of the first substrate 102 or the second substrate 104. Next, the second substrate 104 is aligned with the first substrate 102, wherein the first surface 122 of the second substrate 104 is configured to face the first substrate 102. Next, a display medium layer 106 is dispensed on one of the first substrate 102 and the second substrate 104. And then the second substrate 104 is adhered to the first substrate 102 via the sealant on the first substrate 102.

Figure 9:
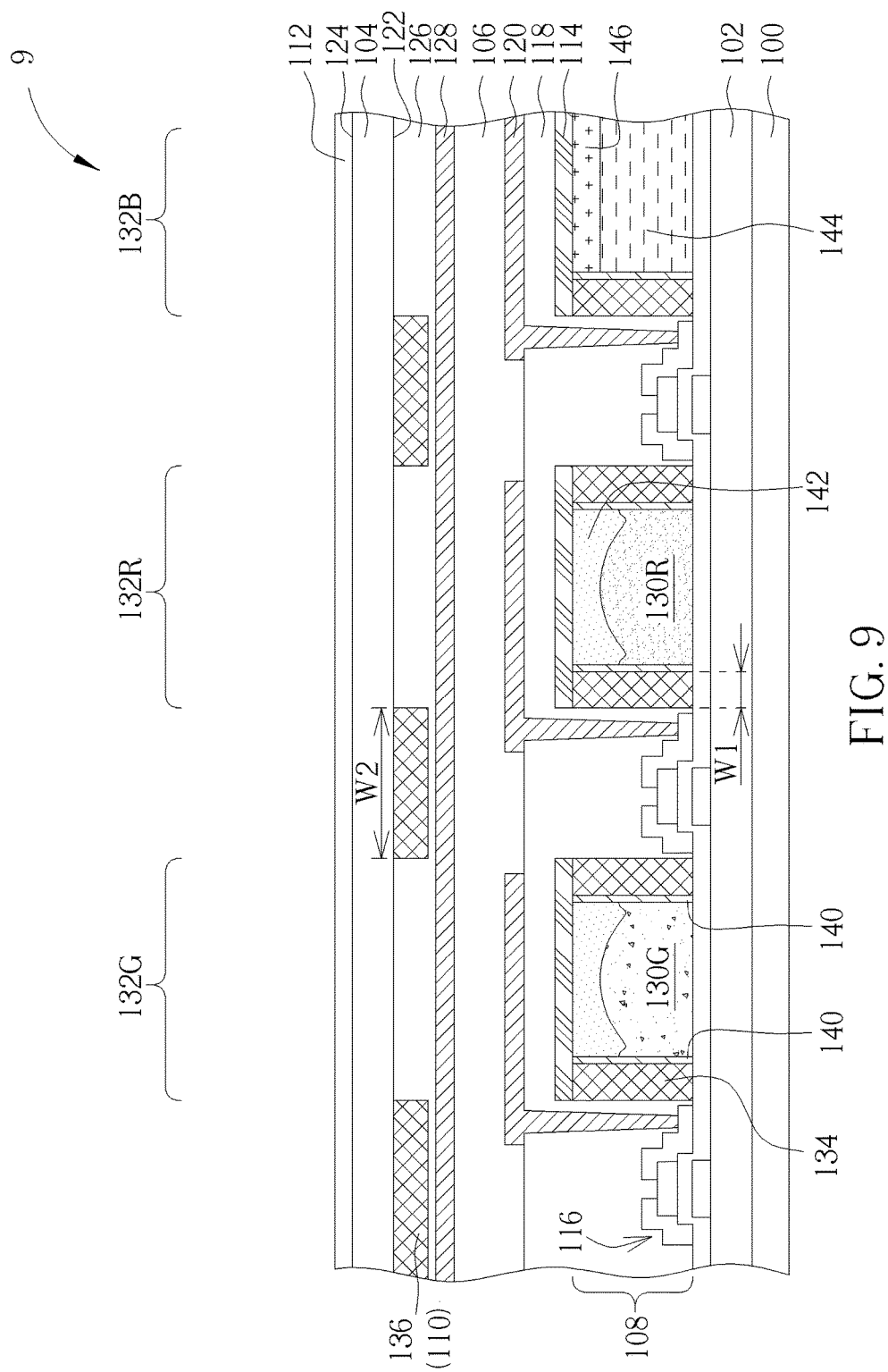
FIG. 9 is a cross-sectional diagram of a display device according to a ninth embodiment of the present disclosure.

Referring to FIG. 9, FIG. 9 is a cross-sectional diagram of a display device 9 according to a ninth embodiment of the present disclosure. As shown in FIG. 9, the main difference between this embodiment and the eighth embodiment is that the light conversion layer 108 is disposed between the first substrate 102 and the passivation layer 118. In this embodiment, the first width W1 of the first shielding portion 134 is less than the second width W2 of the second shielding portion 136, but not limited thereto. The WGPs 114 are disposed between the passivation layer 118 and the light conversion layer 108. The WGPs 114 in this embodiment includes a plurality of patterned metal wires, wherein each WGP 114 is disposed corresponding to one of the pixel electrodes 120 in the apertures of the sub-pixels, and each WGP 114 overlaps the corresponding pixel electrode 120 in the direction perpendicular to the first substrate 102. In some embodiments, the WGP 114 may include a full-layered metal wires disposed between the pixel electrodes 120 and the passivation layer 118. Under this circumstance, the WGP 114 may include via holes so that the pixel electrodes 120 can be connected to the TFTs 116 through the via holes, and an additional insulating layer is required to electrically isolate the pixel electrodes 120 from the WGP 114.

Figure 10:
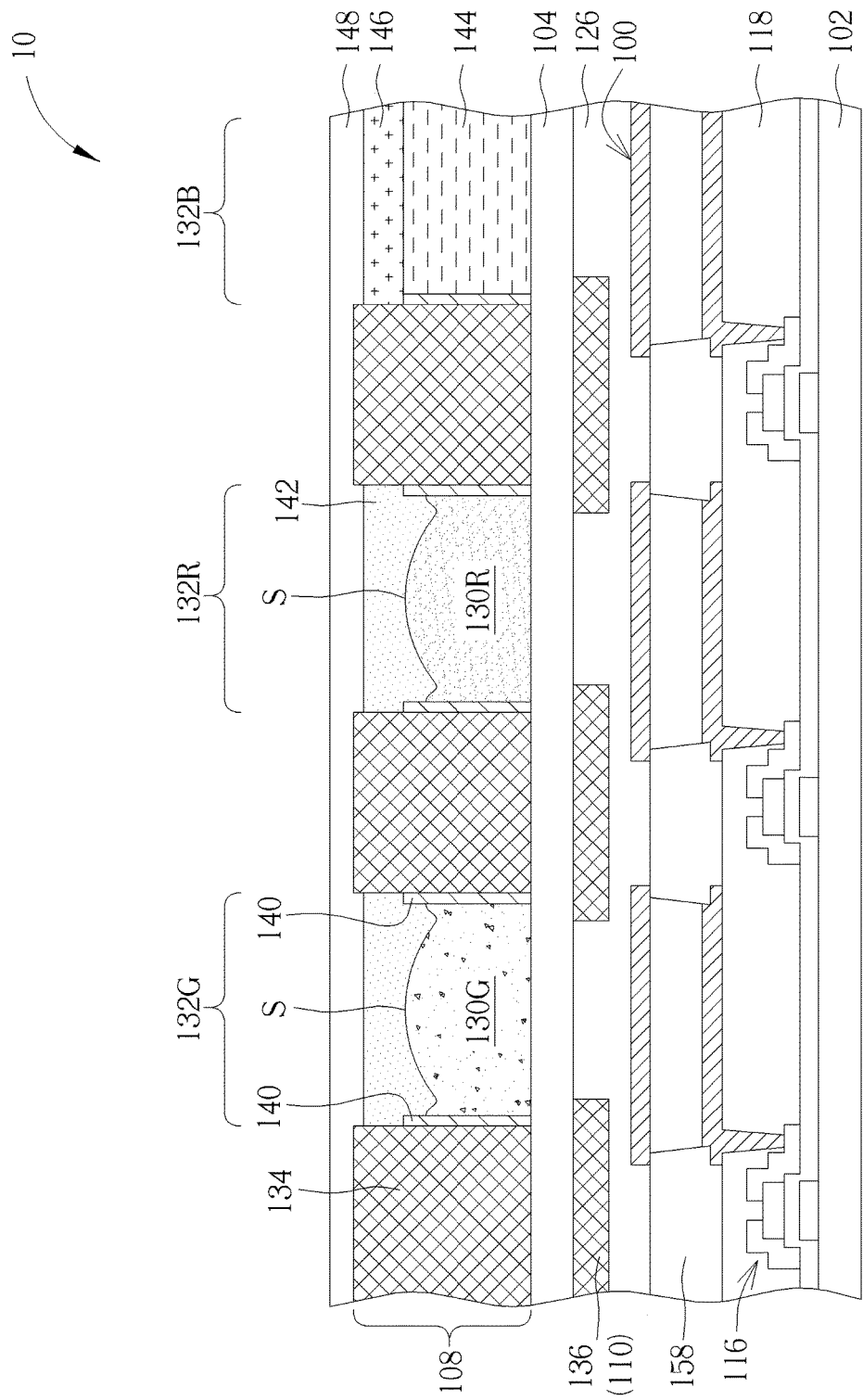
FIG. 10 is a cross-sectional diagram of a display device according to a tenth embodiment of the present disclosure.

FIG. 10 is a cross-sectional diagram of a display device 10 according to a tenth embodiment of the present disclosure. As shown in FIG. 10, the main difference between this embodiment and the second embodiment is that a display device 10 include a plurality of light-emitting units 100 disposed between the first substrate 102 (the TFT substrate) and the light conversion layer 108. The light-emitting units 100 may include light emitting diodes (such as micro LEDs), organic light emitting diodes (OLEDs), or UV light emitting diodes, but not limited thereto. In this embodiment, the light-emitting units 100 are blue OLEDs for example. Specifically, a pixel defining layer 158 and the light-emitting units 100 are disposed between the insulating layer 126 and the passivation layer 118. The light-emitting units 100 are disposed in the pixel defining layer 158, and each light-emitting unit 100 is disposed in an aperture of one of the sub-pixels and electrically connected to a corresponding TFT 116. In addition, the display device 10 does not include the WGP 114 and the polarizer 112, and the curved surfaces S of the first quantum dot portions 130G and the second quantum dot portions 130R in this embodiment are convex surfaces, but not limited thereto. In other embodiments, the curved surfaces S may be concave surfaces.

It should be noted that the technical features in different embodiments of the present disclosure can be combined, replaced, or mixed with one another to constitute another embodiment.

To summarize the above descriptions, in the display device of the present disclosure, the light conversion layer includes different quantum dot portions that can convert the light emitted by the light-emitting unit into different colors of light, and the light conversion layer is used for replacing the conventional color filter layer. Owing to this configuration, the color gamut of the display device can be improved, and the display device can provide a better visual experience. In addition, the full-layered enhancement film is no longer required in the backlight module, and therefore the thickness of the display device can further be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a light-emitting unit;
    a light conversion layer, disposed on the light-emitting unit, the light conversion layer including plural quantum dot portions, a first shielding portion surrounding the plural quantum dot portions, and plural of reflective portions disposed between the first shielding portion and the plural quantum dot portions respectively, wherein a height of the first shielding portion is greater than a height of one of the plural quantum dot portions, and a height of one of the plural of reflective portions is greater than a height of one of the plural quantum dot portions;
    a liquid crystal layer disposed between the light-emitting unit and the light conversion layer;
    a second shielding portion disposed between the liquid crystal layer and the first shielding portion, wherein the second shielding portion is overlapped with the first shielding portion, and a width of the second shielding portion is greater than a width of the first shielding portion;
    a first polarizer disposed between the light conversion layer and the liquid crystal layer; and
    a second polarizer disposed between the light-emitting unit and the liquid crystal layer;
    wherein one of the plural quantum dot portions has a surface and at least a part of the surface is a curved surface.

2. The display device of claim 1, wherein the curved surface is a convex surface.

3. The display device of claim 1, wherein the curved surface is a concave surface.

4. The display device of claim 1, wherein a thickness of one of the plural quantum dot portions is between 3 μm and 130 μm.

5. The display device of claim 4, wherein the thickness of the one of the plural quantum dot portions is between 3 μm and 70 μm.

6. The display device of claim 1, wherein a concentration of quantum dot particles in one of the plural quantum dot portions is between 0.3 wt % and 13.4 wt %.

7. The display device of claim 6, wherein the concentration of quantum dot particles in the one of the plural quantum dot portions is between 0.5 wt % and 13.4 wt %.

8. The display device of claim 1, wherein the first shielding portion has a first thickness and the second shielding portion has a second thickness, wherein a ratio of the first thickness to the second thickness is between 1.5 and 650.

9. The display device of claim 1, wherein a difference between the second width and the first width is between 2 μm and 62 μm.

10. The display device of claim 1, the light conversion layer further including plural filtering portions respectively disposed on some of the plural quantum dot portions.

11. The display device of claim 1, further comprising a TFT substrate, wherein at least one thin-film transistor is disposed on the TFT substrate, and the TFT substrate is disposed between the light-emitting unit and the light conversion layer.

12. The display device of claim 1, wherein the first shielding portion includes two or more first shielding units stacked with each other, and the two or more first shielding units respectively include different materials.

13. The display device of claim 1, wherein at least one of the first polarizer and the second polarizer comprises a wire grid polarizer.

14. The display device of claim 1, wherein the light-emitting unit produces blue light or ultraviolet (UV) light.

* * * * *